United States Patent [19]
Kanithi

[11] Patent Number: 5,689,875
[45] Date of Patent: Nov. 25, 1997

[54] SUPERCONDUCTOR WITH HIGH VOLUME COPPER

[75] Inventor: Hem C. Kanithi, Cheshire, Conn.

[73] Assignee: IGC Advanced Superconductors, Waterbury, Conn.

[21] Appl. No.: 664,393

[22] Filed: Jun. 14, 1996

Related U.S. Application Data

[62] Division of Ser. No. 264,594, Jun. 23, 1994, abandoned.

[51] Int. Cl.⁶ .................................................. H01B 12/00
[52] U.S. Cl. ............................ 29/599; 228/148; 228/265; 228/126; 228/130
[58] Field of Search .......................... 228/148, 265, 228/126, 129, 130; 29/599

[56] References Cited

U.S. PATENT DOCUMENTS

| | | | |
|---|---|---|---|
| 3,235,954 | 2/1966 | Fromson | 228/148 |
| 3,453,725 | 7/1969 | Donelan et al. | 29/599 |
| 3,562,899 | 2/1971 | Stout et al. | 228/130 |
| 3,570,118 | 3/1971 | Reynolds et al. | 29/599 |
| 3,596,349 | 8/1971 | Boom | 29/599 |
| 3,662,093 | 5/1972 | Wilson et al. | 174/128 |
| 3,686,750 | 8/1972 | Woolcock et al. | 29/599 |
| 3,710,000 | 1/1973 | Shattes et al. | 174/128 X |
| 4,044,457 | 8/1977 | Strauss et al. | 29/599 |
| 4,554,407 | 11/1985 | Ceresara et al. | 29/599 X |
| 4,906,609 | 3/1990 | Yamauchi et al. | 29/599 X |
| 4,912,443 | 3/1990 | Heyne et al. | 174/125.1 X |
| 4,977,039 | 12/1990 | Onishi et al. | 174/125.1 X |
| 5,088,183 | 2/1992 | Kanithi | 29/599 |

FOREIGN PATENT DOCUMENTS 2208812  9/1972  German Dem. Rep. .

*Primary Examiner*—Kenneth J. Ramsey
*Attorney, Agent, or Firm*—Helfgott & Karas, P.C.

[57] ABSTRACT

Large amounts of stabilizing copper may be added to a superconducting core using an economical cladding process. One or more cladding strips of copper are bonded directly to the core without the use of a bonding agent. The copper cladding is fused to the core at a late stage in the fabrication of the superconductor by the simultaneous application of heat and pressure using conventional rolling apparatus. Multiple cladding layers may be sequentially applied to further increase the volume of copper present in the superconductor.

12 Claims, 2 Drawing Sheets

SUPERCONDUCTOR WITH HIGH VOLUME COPPER

This is a division of application Ser. No. 08/264,594, filed Jun. 23, 1994, now abandoned.

BACKGROUND OF THE INVENTION

1. Field of the Invention

The present invention relates in general to copper clad superconducting wires and cables and, in particular, to an economical method for cladding large volume fractions of copper to multifilament wires and cables and to monofilament restack rods.

2. Description of Prior Developments

According to conventional practice, copper is used as a stabilizing material, i.e. a normal or nonsuperconducting material, in composite superconductors. Large volume fractions of copper stabilizing material are needed in some applications for reliable and safe operation of various superconducting devices, such as used in association with MRI apparatus. Accumulative costs of processing the copper from its initial billet assembly to its final sizing can triple or quadruple the initial per-pound cost of copper as it is processed into superconducting wires and cables.

In conventionally manufactured high Cu/SC ratio superconductors, the processing costs that can be attributed to copper become a significant fraction of the overall costs. The copper components in these products incur virtually all of the processing costs, including cleaning, welding, extrusion, transportation, rod and wire drawing, and heat treating.

There have been several attempts to circumvent these accumulative processing costs. One approach is to solder a composite superconducting core in the form of a relatively low copper/superconductor (Cu/SC) volume ratio strand or cable within a copper channel. Another approach is to place a low Cu/SC volume ratio super-conducting rod inside a copper tube and co-process the assembly on draw benches and bull blocks, as disclosed in U.S. Pat. No. 4,723,355 and which is incorporated herein by reference.

Both of these known approaches can reduce the final cost of fabricating copper-stabilized superconductors. The extent of the savings is a function of the final desired Cu/SC volume ratio. In general, the higher this ratio, the more is the cost savings. Nevertheless, a need presently exists for an even lower cost manufacturing process for producing a superconducting copper covered wire or cable. This need is particularly felt in the manufacture of such products requiring a high volume of fraction copper.

SUMMARY OF THE INVENTION

The present invention has been developed to fulfill the needs noted above, and therefore has as an object the provision of a low cost process for manufacturing a copper clad superconducting wire, rod or cable. In accordance with the present invention, a composite superconducting wire rod or cable having a relatively low volume fraction of copper is clad at a very late stage of super-conductor manufacture so as to circumvent and obviate most of the copper processing costs associated with conventional superconductor manufacturing techniques.

In particular, copper is clad around a monofilament or multifilament superconducting core using heat and pressure and/or continuous seam welding. The copper cladding material is applied directly around the surface of a superconducting core without the aid of any intermediary bonding agent. Heat and pressure are applied simultaneously during cladding, as opposed to prior techniques which separated the heating and pressurizing steps into a sequential multi-step process. In this manner, the invention adds relatively large volume fractions of copper to a superconducting core having a relatively low Cu/SC ratio so as to produce a copper clad superconductor having a relatively large volume fraction of copper.

The superconducting core can be monofilament or multifilament wires embedded in a copper shell or copper matrix whereby the copper cladding will be over the copper. Additionally, the core can be the superconducting alloy wire itself with the cladding directly onto the wire material.

After the superconducting core is clad according to the invention, the resultant product may be further processed to a desired final size so as to yield further benefits. For example, subsequent drawing of the superconductor through a die or a series of dies will provide the copper cladding with a smooth continuous surface finish suitable for the application of film-type insulation coatings. Superconductor cables made according to conventional solder methods do not readily accept such films due to the presence of low melting solder residue and a somewhat uneven seam.

The aforementioned discussed copper cladding would be over low critical temperature superconducting (LTS) material, such as Niobium-Titanium based superconductors or even Niobium Tin based material or others. However, the present invention could also be used to clad silver over high critical temperature superconducting (ITS) cores.

The aforementioned objects, features and advantages of the invention will, in part, be pointed out with particularity, and will, in part, become obvious from the following more detailed description of the invention, taken in conjunction with the accompanying drawings, which form an integral part thereof.

BRIEF DESCRIPTION OF THE DRAWINGS

In the drawings.

In the various figures of the drawing, like reference characters designate like parts.

DETAILED DESCRIPTION OF THE PREFERRED EMBODIMENTS

The present invention takes advantage of a cladding technique wherein one or more initially flat copper strips are joined to a superconducting core by the simultaneous application of pressure and heat. Specifically, welding of the longitudinal edges of cladding strips and bonding of the copper strips directly to the superconducting core are accomplished by a simultaneous application of heat, pressure and metal deformation. Welding in some cases may be achieved or augmented by application of a continuous electric arc.

The input materials, i.e. the superconducting core and copper cladding, are heated, brought together and rolled within a controlled atmosphere, such as an inert or reducing gas, which protects the materials from oxidation. Varying copper fractions can be obtained by adjusting the relative amounts of copper in the superconducting core 10 and in the thickness of the cladding strips. This technique effectively clads multifilament superconductors so as to increase the overall Cu/SC volume ratio and thereby increases the amount of copper stabilizing material present in the superconductor.

Since the current carrying capacity (Jc) of the superconducting core is heat sensitive, the temperatures employed in the copper cladding process necessary to achieve a metallurgical copper weld or bond must be carefully controlled. The temperature that the superconducting core reaches during the cladding process should generally be maintained below approximately 900° F. in order to prevent Jc degradation in NbTi core filaments.

Therefore, the diameter or size of the multifilament or monofilament core relative to the final conductor size and the size at the last precipitation heat treatment should be optimized together. It is also possible to augment the precipitation of Alpha Titanium (necessary to enhance Jc) by the heat applied to the superconducting core during the cladding step.

Figure 1:
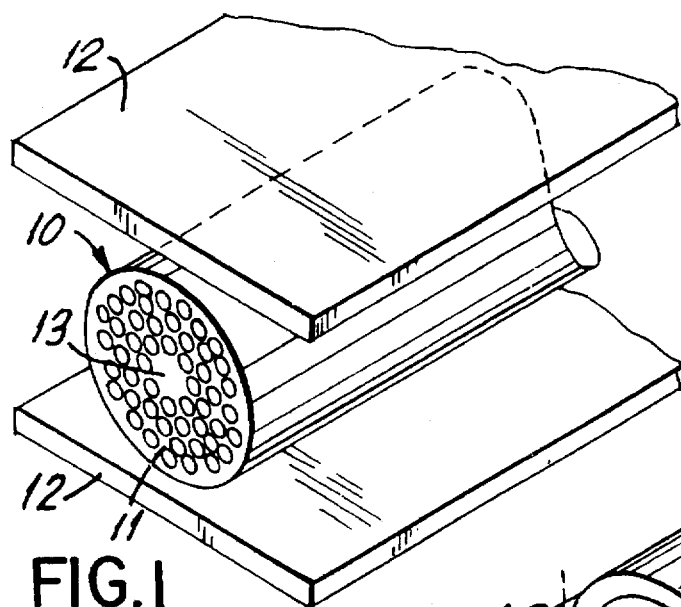
FIG. 1 is a schematic end view of a pair of copper cladding strips and a multi-filamentary superconducting core prior to cladding.
Figure 2:
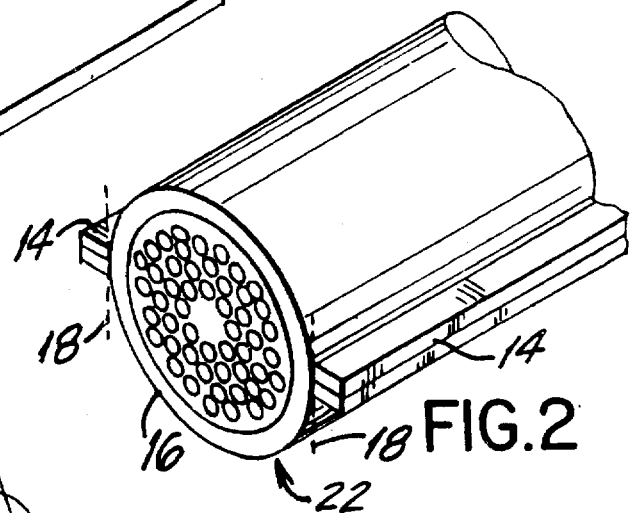
FIG. 2 is a schematic end view of the copper strips and core of FIG. 1 after cladding according to the invention.

One example of a cladding technique carried out in accordance with the invention is shown in FIGS. 1 and 2. A conventional multifilamentary superconducting core 10 composed of filaments of NbTi 11 or other suitable superconducting material and a surrounding matrix 13 of copper is sandwiched between a pair of initially flat, tape-like copper strips 12 using a conventional rolling technique, such as presently used to manufacture copper clad steel wire. Core 10 may initially have a relatively low volume amount of copper as compared to the volume of superconducting core material present. For example, the Cu/SC volume ratio of core 10 can be in the range of about 0.6:1 to 6.0:1.

The rolling process of FIGS. 1 and 2 produces a pair of crimped, longitudinally-extending, radially-projecting seams 14 and a cylindrical tubular cladding layer 16 of copper. Seams 14 are removed by shearing, shaving, machining or by other conventional manner along shear lines 18 using conventional methods. After removal, a substantially circular cross section is produced.

Each strip 12 is bonded to the core 10 in a mutually symmetrical manner such that each strip 12 covers about one-half of the outer surface of core 10. During the rolling process, copper cladding layer 16 is radially compressed and intimately extruded and bonded to the multifilamentary superconducting core 10. The relative size of core (10) and the thickness of copper strips (12) may be selected such that the added copper in the clad product (22) is about 10 to 90 percent of the final cross section.

Figure 3:
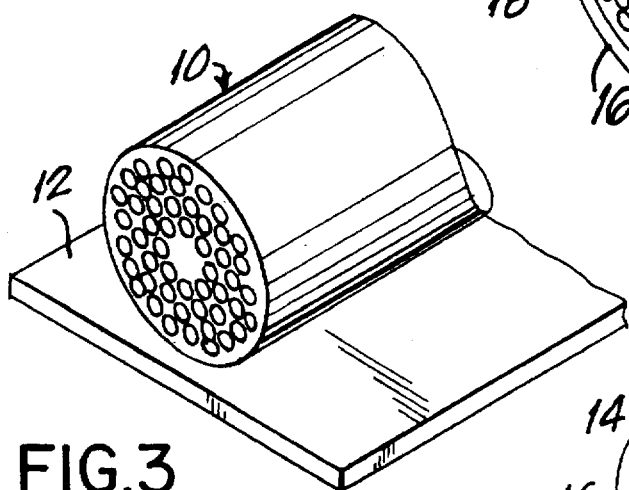
FIG. 3 is a schematic end view of a single copper cladding strip and multifilamentary superconducting core prior to cladding.
Figure 4:
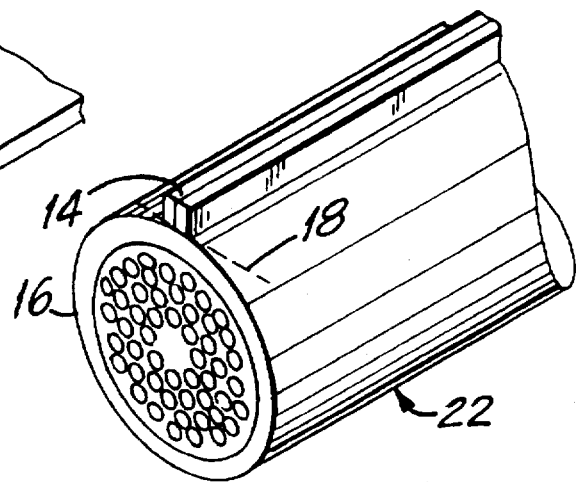
FIG. 4 is a schematic end view of the copper strip and core of FIG. 3 after cladding according to the invention.

In the example of FIGS. 3 and 4, a single copper cladding strip 12 may be used instead of two strips as in the initial example. Again, conventional rolling apparatus may be employed such as a series of opposed rollers which sequentially curl each strip closer around the surface of core 10. In this case, only a single longitudinal seam 14 is produced along the abutted longitudinal end portions of the cladding strip 12. Seam 14 is sheared tangentially with respect to the cladding layer 16 as noted above so as to provide a circular cross section to product 22.

As the copper strip or strips are rolled and deformed around the superconducting core in each of the previous examples, each cladding strip 12 is maintained at an elevated temperature by being heated up to a temperature preferably no greater than approximately 900° F. A low temperature is preferred since it limits the heat conducted into the superconductor core and prevents degradation of the current carrying capacity, Jc, of the multifilamentary superconducting core 10.

The heating can be achieved by heating the core 10, or the copper strip 12, or both. Also, any known type of process can be used such as electrical resistance type, radiant heating, convective heating, induction heating, etc.

Although a single annular copper cladding layer is applied in each of FIGS. 1–4, it is possible to repeat each cladding process two or more times to produce a resulting multi-layered superconductor having an extremely high Cu/SC volume ratio. Each exemplary cladding process may be repeated on its own end product, or mixed with another cladding process. For example, the end product 22 of FIG. 2 may serve as the core 10 for the alternate cladding process of FIG. 3, and vice versa.

It is generally advantageous to repeat the cladding processes several times rather than attempt to add a large percentage of copper cladding in one step, insofar as technical difficulties may develop in the latter case. That is, inadequate pressure may be applied between an excessively thick copper strip or strips 12 and the core 10, thereby resulting in a poor bond between the core and cladding. In addition, the core 10 may become overheated and experience Jc degradation due to excessive conductive heat transfer to the core from thick copper cladding strips which act as heat sources.

Jc degradation is manifested when the copper cladding strips are heated to a higher temperature than the core in order to produce an acceptable bond along the seam 14 and to the copper in the core. This situation may be overcome by augmenting the strip-to-strip joining process by an external welding method limited to seam 14. In this manner, only the seams 14 are heated to a significantly higher temperature than the core. By the use of thinner strips and cladding more than once, acceptable bonding at all critical areas can be achieved.

Material that is clad at least once can be reduced by other conventional methods, such as extrusion, rolling, swaging or wire drawing to a size suitable for the subsequent cladding step. From the point of economics, cladding in three separate steps, i.e. adding three cladding layers to the superconducting core, will generally be less cost-effective than cladding twice. Cladding more than three times may provide a diminishing cost advantage.

Figure 6:
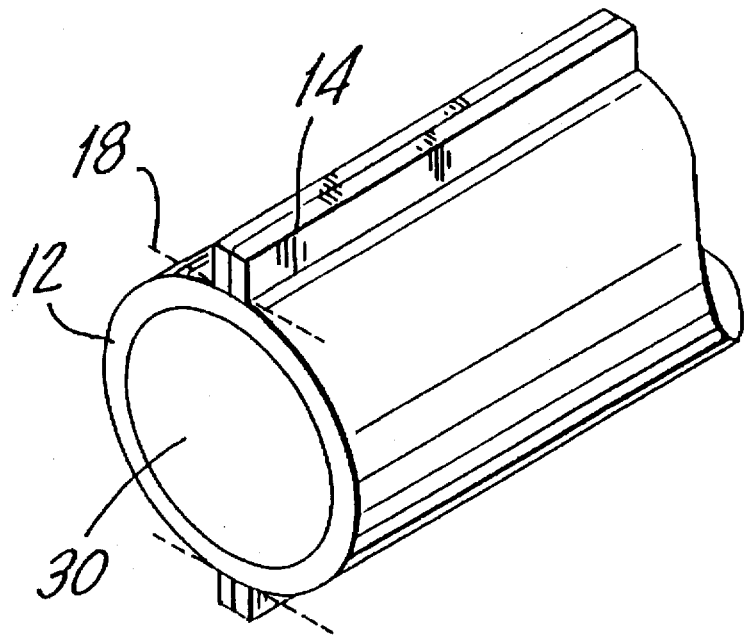
FIG. 6 is a schematic end view of an alternate embodiment of the invention which uses the cladding directly over a monofilament wire material.

As shown in FIG. 6, copper cladding according to another embodiment of the invention is also applicable to a monofilament core configuration. A single core of NbTi superconducting material with or without a copper shell around it is shown at 30 and is copper clad with copper 12 using any of the techniques noted above. When the core is entirely composed of NbTi, the desired amount of copper can be clad and the product further reduced, if necessary, to a size suitable for multifilament billet assembly. The NbTi could also have a shell of copper around it and this can then be copper clad.

Similarly, a monofilament restack rod can be economically produced according to the invention from a core of monofilament NbTi material which is initially processed with a thin shell of copper. The original thin copper shell over the NbTi core is used primarily to facilitate extrusion and drawing from a large billet. This core can be clad with additional copper strip in order to increase its overall Cu/SC ratio. The strip(s) used in the monofilament cladding can be made from pure copper or alloyed copper (such as CuNi, CuMn, CuSi) for specialized applications.

The advantage of this approach is that the final resulting monofilament restack rod will be less expensive than a conventionally made restack rod produced using an extrusion "can" since one or more inexpensive copper strips are applied in accordance with the invention to the restack material late in the fabrication process thereby eliminating the cost of processing a sizable volume fraction of expensive copper. Copper in the form of an extrusion can is typically twice as expensive per pound as it is in strip form.

There is more freedom to vary the temperatures to which a monofilament core and/or the copper strips can be heated during the cladding operation than there is when cladding a multifilament core. A high degree of bonding at all interfaces of a monofilament restack rod is not necessary since the typical hot extrusion of a subsequent multifilament billet assembled from the monofilament restack rods will result in good bonding. The cladding temperature can be intentionally kept either low to maintain a wrought microstructure in the core NbTi alloy, as is desired for high Jc applications, or high to anneal the alloy, as is desired for small wire diameters and long lengths.

Figure 5:
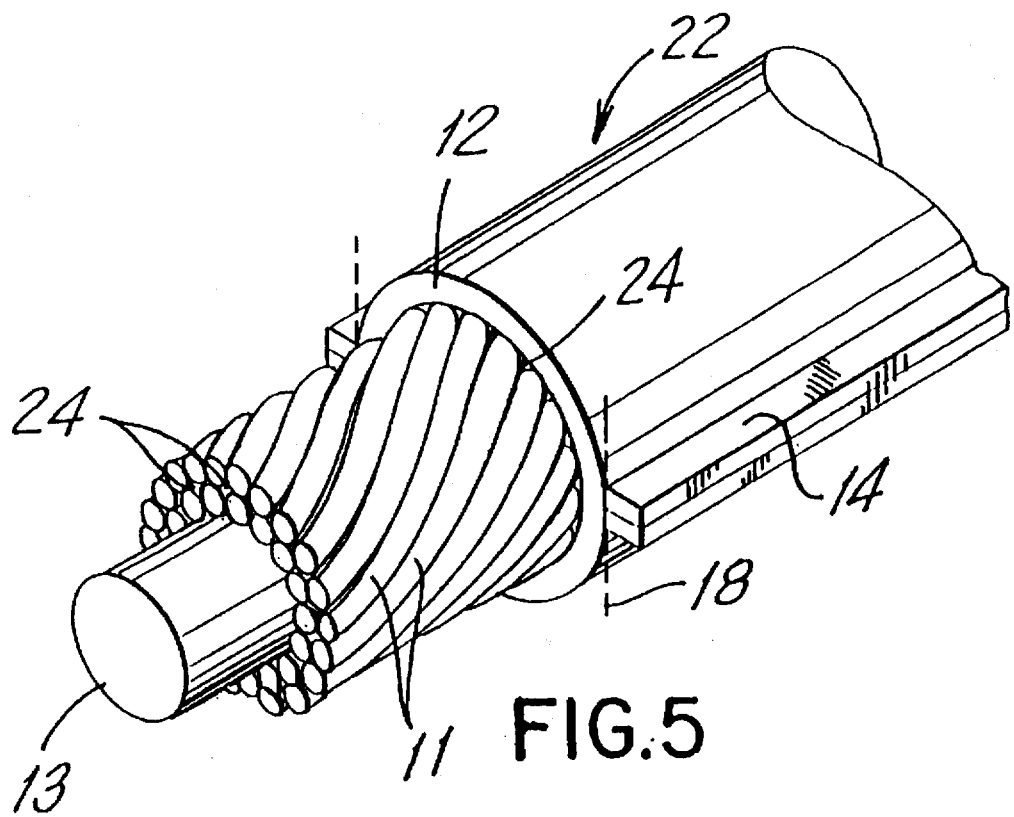
FIG. 5 is a schematic end view of an alternate embodiment of the invention which incorporates a central copper core surrounded by monofilament composite strands of Cu and NbTi.

The cladding techniques set forth above can also be applied to produce multifilamentary superconductors without going through a conventional multifilament billet extrusion step. A Cu/NbTi monofilament composite can be manufactured into a small strand which is then used to produce a multistrand cable with or without a copper core. This cable, when employed as the superconducting core in the instant cladding process, will result in a superconducting composite such as shown in FIG. 5. This assembly can be processed further to a final multifilamentary monolithic conductor.

In FIG. 5, cable 22 is constructed with a copper core 13, a pair of cladding strips 12, and a plurality of monofilament strands 11 of Cu/NbTi. The cladding step compacts and consolidates the cable and thereby removes or reduces void spaces 24 and imparts the necessary bond at all interfaces. Additional drawing further consolidates the cable 22.

The fusing of the monofilament strands 11 during cladding produces a continuous matrix of copper similar to conventionally manufactured superconductors. Heat treatments intended to precipitate alpha titanium phase within NbTi can be carried out during the monofilament strand processing and/or after the clad composite is made. Any heat treatments performed after cladding will further enhance copper-to-copper bonding.

In another variation of the above cladding over cable, the monofilament strands 11 in FIG. 5 can be replaced by multifilament strands of NbTi/Cu to achieve a final product with a large number of fine filaments. Fine filamentary superconductors are required in High Energy Physics particle accelerator magnets and for alternating current applications.

In superconductor manufacturing technology involving Artificial Pinning Centers (APC) it is desired to reduce the size of individual constituents to a nanometer scale and it is usually accomplished by repeated bundling and extrusion steps. In these instances the use of this cladding technique incorporating multifilament strands will eliminate the need for an extrusion step.

When using high temperature superconducting material, typically silver is used as the matrix material or outer shell. The present cladding techniques can thus also be used to clad layers of silver onto the superconducting core. In place of pure silver, alloys of silver or dispersion strengthened silver, may be used for the strip material to produce strong final product.

Obviously, numerous modifications and variations of the present invention are possible in light of the above teachings. It is therefore to be understood that within the scope of the appended claims, the invention may be practiced otherwise than as specifically described herein.

What is claimed is:

1. A method for producing a clad superconductor, comprising the steps of:
   (a) providing a prefabricated superconductive core having an outer surface and including superconducting elements within a matrix, said matrix including a first highly conductive stabilizing material;
   (b) providing at least one strip of a second highly conductive stabilizing material, each said strip having an inner surface and a pair of longitudinal edges;
   (c) positioning said at least one strip of said second highly conductive stabilizing material with said inner surface in contact with said outer surface of said core;
   (d) applying heat and pressure to said at least one strip to wrap said at least one strip around said core until adjacent pairs of said edges make contact to form a seam;
   (e) without using an intermediate bonding material, fusing substantially an entire inner surface of said at least one strip to said outer surface of said core and fusing said contacting adjacent edges together by said application of heat and pressure,
   said at least one strip becoming a cladding layer for said core after said wrapping and fusing.

2. A method as in claim 1, wherein said superconducting elements include filaments longitudinally fixed and extended in said matrix.

3. A method as in claim 2, wherein said matrix is copper.

4. A method as in claim 1, wherein said matrix is round in cross-section and said cladding layer is concentric with said matrix.

5. A method as in claim 4, wherein said matrix is copper.

6. A method as in claim 5, wherein said at least one strip is one copper, silver and silver alloy.

7. A method as in claim 1, wherein said at least one strip is one of copper, silver, and silver alloy.

8. A method as in claim 1, wherein said matrix is round in cross section and further comprising the step of removing excess material of said at least one strip at said contacting edges to produce a circular cross section for said clad superconductor.

9. A method as in claim 8, further comprising the step of reducing the cross section while elongating said clad superconductor.

10. A method as in claim 1, wherein said steps (a)–(e) are repeated using a product of first steps (a)–(e) as a superconductive core in repeated step (a).

11. A method as in claim 1, wherein said superconductive core is at an elevated temperature.

12. A method as in claim 1, wherein the filaments are heated to a temperature not exceeding approximately 900° F.

* * * * *